(12) United States Patent
Torii et al.

(10) Patent No.: US 6,380,574 B1
(45) Date of Patent: Apr. 30, 2002

(54) FERROELECTRIC CAPACITOR WITH A SELF-ALIGNED DIFFUSION BARRIER

(75) Inventors: Kazuyoshi Torii, Kodaira; Yasuhiro Shimamoto, Hachioji; Hiroshi Miki, Tokyo; Keiko Kushida, Kodaira; Yoshihisa Fujisaki, Hachioji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/674,392

(22) PCT Filed: May 25, 1998

(86) PCT No.: PCT/JP98/02274

§ 371 Date: Oct. 31, 2000

§ 102(e) Date: Oct. 31, 2000

(87) PCT Pub. No.: WO99/62116

PCT Pub. Date: Dec. 2, 1999

(51) Int. Cl.[7] .......................... H01L 29/76; H01L 29/94
(52) U.S. Cl. .................... 257/295; 257/310; 365/65; 438/3
(58) Field of Search ................ 257/295, 310; 365/65; 438/3

(56) References Cited

U.S. PATENT DOCUMENTS

| | | | | |
|---|---|---|---|---|
| 5,392,189 A | * | 2/1995 | Fazan et al. | 361/305 |
| 5,418,388 A | * | 5/1995 | Okudaira et al. | 257/295 |
| 5,619,393 A | * | 4/1997 | Summerfelt et al. | 361/321.1 |
| 5,843,818 A | * | 12/1998 | Joo et al. | 438/240 |
| 6,131,258 A | * | 10/2000 | Saenger | 29/25.42 |
| 6,191,443 B1 | * | 2/2001 | Al-Shareef et al. | 257/310 |
| 6,204,172 B1 | * | 3/2001 | Marsh | 438/653 |
| 6,211,034 B1 | * | 4/2001 | Visokay et al. | 438/396 |

FOREIGN PATENT DOCUMENTS

| | | |
|---|---|---|
| JP | 5-291526 | 11/1993 |
| JP | 7-21784 | 1/1995 |
| JP | 8-139043 | 5/1996 |
| JP | 10-50956 | 2/1998 |
| JP | 10-93041 | 4/1998 |

OTHER PUBLICATIONS

A. Yuuki, et al., "Novel Stacked Capacitor Technology for 1 Gbit DRAMs with CVD–(Ba,Sr) $TiO_3$ Thin Films on a Thick Storage Node of Ru", IEDM 95 Tech. Digest, pp. 115–118, 1995.

S. Yamamichi, et al., "An ECR MOCVD (Ba,Sr) $TiO_3$ based stacked capacitor technology with $RuO_2$/Ru/Tin/$TiSi_x$ storage nodes for Gbit–scale DRAMs", IEDM 95 Tech. Digest, pp. 119–122, 1995.

* cited by examiner

Primary Examiner—Michael S. Lebentritt
Assistant Examiner—Christian D. Wilson
(74) Attorney, Agent, or Firm—Miles & Stockbridge P.C.

(57) ABSTRACT

A diffusion preventive layer extending between the bottom surface of a lower electrode and an interconnection connecting the lower electrode to one of the diffusion layers of a switching transistor is self-aligned. As a result, no side trench is produced since a hole pattern is formed by using a dummy film, and even if a contact plug of a memory section is misaligned with the diffusion preventive layer, the contact plug is out of direct contact with a dielectric film having a high permittivity. Hence, a highly reliable device can be obtained.

35 Claims, 19 Drawing Sheets

FERROELECTRIC CAPACITOR WITH A SELF-ALIGNED DIFFUSION BARRIER

TECHNICAL FIELD

This invention concerns a device using a ferroelectric thin film and, more in particular, it relates to a capacitor for polarization reversion type non-volatile memories or dynamic random access memories suitable to large scale integrated circuits (LSI).

BACKGROUND ART

Ferroelectric materials include those having a specific permittivity as high as from several hundreds to several thousands. Accordingly, when a thin film of such ferroelectric material is used for a capacitor insulation film, a capacitor of a small area and a large capacity suitable to large scale integrated circuits (LSI) can be obtained. Further, since the ferroelectric material has spontaneous polarization and the direction thereof can be reversed by external electric fields, a non-volatile memory can be obtained by utilizing such characteristic. As ferroelectric thin films in the memory using ferroelectric material, oxide ferroelectrics such as lead zirconate titanate and strontium barium titanate are generally used.

While the ferroelectric material has high dielectric permittivity, charges required for obtaining sufficient reliability can not be stored in a plane capacitor, for example, in 1 Gbit DRAM even when a capacitor dielectric film with the dielectric permittivity of 250 is used, so that a three-dimensional capacitor structure is necessary. Trial manufacture for 1 Gbit DRAM has been reported, for example, in I.E.E.E., I.E.D.M. Technology Digest 1995, p 119 (IEDM' 95 Tech, Digest pp 119, 1995) or I.E.E.E., I.E.D.M. Technology Digest 1995, p 115 (IEDM' 95 Tech, Digest pp 115, 1995). Memory cells used in the prior art described above have a structure as shown in FIG. 20. A semiconductor substrate formed with a switching MOS transistor including a gate oxide film 202 and a gate electrode 203 is covered with an interlayer insulation film 206 and, after flattening an underlying step, a diffusion barrier layer 207 is formed thereon to form a dielectric capacitor of high dielectric permittivity comprising a lower electrode 208, a high permittivity dielectric film 209 and a plate electrode 210. Platinum, ruthenium, ruthenium dioxide or the like is used for the lower electrode 208. In this structure, connection with one electrode 208 of the ferroelectric capacitor and the source or drain of the MOS transistor is conducted with conductive material 205 buried in a contact hole perforated in an insulation material. In the drawing, 204 denotes a bit line and 201 denotes an inter-device isolation film. As described above, by forming the lower electrode as a cuboid electrode and utilizing the lateral sides thereof, a capacitor having a large area in one identical plane area can be attained.

However, the existent structure as shown in FIG. 20 involves a problem that a lateral side 211 of the diffusion barrier layer 207 is oxidized and peeled during the preparation of a high dielectric permittivity dielectric material 209. Further, when a mask defining the bottom of the memory contact and the storage capacitor are misaligned, this may possibly cause a problem that a memory contact plug 205 and the capacitor insulation film 209 are brought into a direct contact in which the memory contact plug is oxidized to cause conduction failure due to an oxidizing atmosphere upon preparing the high permittivity dielectric film 99, or the memory contact plug is scraped upon fabricating the lower electrode.

To fabricate higher density memories with the existent structure, since it is necessary to further enlarge the lateral area for ensuring the capacitance of a capacitor, it is required to make this cuboid lower electrode 207 finer and higher. For example, considering DRAM of a minimum fabrication size of 0.13 µm, it is expected that fabrication to make the aspect ratio of the cuboid to 3–5 will be necessary. However, ultra fine fabrication technique of such material has not been well established and, particularly, ultra fine patterning with the high aspect ratio is difficult. Further, for increasing the height of the electrode, it is at first necessary to deposit the material for the lower electrode such as ruthenium dioxide by so much as the thickness for the required height. However, as the film thickness increases, it results in a problem of taking long deposition time or tending to cause peeling by the stress of the film itself, to lower the yield.

On the other hand, it has been proposed a structure of forming a diffusion barrier layer only in the contact hole or using TiN, W for the contact plug. However, even when such method is used, problems such as oxidation of the diffusion barrier layer and scraping of the lower electrode upon fabrication can not be avoided.

For avoiding the problem in the prior art, as shown in FIG. 25, JP-A No. Hei 5-291526 proposes a structure of forming a lower electrode 81 into a thin wall shape in the inside of a cylindrical hole opened to a thick insulation film. However, application of this structure to a high dielectric permittivity dielectric capacitor results in the following problem. That is, in the high dielectric permittivity dielectric capacitor, material such as platinum, ruthenium or ruthenium dioxide is used for the lower electrode. However, when one of the diffusion layers of the switching MOS transistor and the lower electrode of the capacitor are connected, silicidation reaction occurs if the material is in direct contact with silicon 53, or silicon is oxidized at the electrode/silicon interface to increase resistance. Accordingly, it is necessary to dispose a diffusion barrier layer between the electrode 81 and the silicon 53. If the diffusion barrier layer and the lower electrode bottom face are misaligned, a side trench 261 is formed as shown in FIG. 26 due to the difference of the etching rate between the underlying interlayer insulation film and the diffusion barrier layer when a hole as a capacitor region is opened to the thick insulation film, to deteriorate the reliability.

This invention has been achieved in order to overcome the foregoing problems and it intends to provide a semiconductor device capable of attaining a higher density memory, as well as a method for manufacturing the same.

DISCLOSURE OF THE INVENTION

Means for Dissolution

The object described above can be attained by depositing a diffusion barrier layer, then forming a second film for defining a capacitor region, etching the second film and the diffusion barrier layer selectively to conduct patterning, fabricating the same into an island pattern of a capacitor region, then forming a thick insulation film thereby burying the island pattern into the thick insulation film and then removing the second film buried in the insulation film thereby forming the bottom of the hole as the capacitor region and the diffusion barrier layer.

Further, the object can be attained by providing a diffusion barrier layer disposed to the bottom of a hole of an insulation film on a substrate formed with a transistor and a lower electrode of a capacitor formed in self alignment with the underlying diffusion barrier layer from the bottom to the lateral side of the hole. The lower electrode and the diffusion barrier layer are formed in a substantially identical pattern.

With the constitution described above, since the side wall of the hole as the capacitor region is used for the capacitance of the capacitor, a capacitor of a large capacitance suitable for high density memories can be obtained. Further, since the diffusion barrier layer is formed in self alignment at the bottom of the hole as the capacitor region, side trench upon forming the hole as the capacitor region can be prevented without increasing the memory cell area. Further, even when the storage node contact plug and the diffusion barrier layer are misaligned, the contact plug and the high dielectric permittivity dielectric film are not in direct contact with each other to obtain a device of high reliability.

The diffusion barrier layer is a layer for preventing reaction between the lower electrode and the plug, for which Ti, Ta, TiN, $Al_xTi_{1-x}N$, Ru, or a laminate film thereof is used.

Further, as the capacitor dielectrics, there can be used, in addition to tantalum oxide, perovskite-type oxides, for example, strontium barium titanate, strontium titanate, barium titanate, lead zirconate titatane and barium lead zirconate titanate.

Further, since the second film is a film for defining the capacitor region, any material may be used therefor. In a case of using tungsten, for example, the film can be formed more simply and conveniently since the tungsten film and the titanium nitride film of the diffusion barrier layer can be etched continuously by using an $SF_6$ gas.

BEST MODE FOR PRACTICING THE INVENTION

EXAMPLE 1

Figure 2:
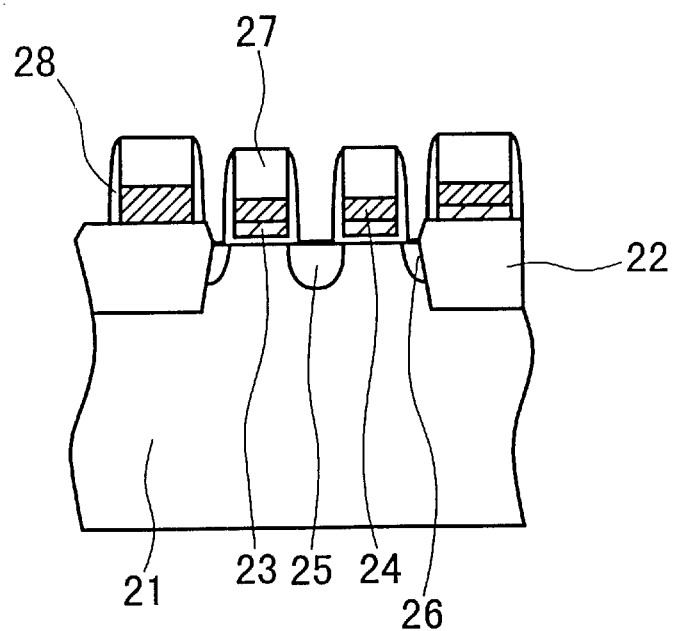
FIG. 2 is a first cross sectional view illustrating a manufacturing step for a semiconductor device of a first example according to this invention.

FIG. 2 to FIG. 9 show examples for manufacturing a memory cell by applying this invention. At first, as shown in FIG. 2, a field oxide 22 and a gate oxide film are formed on a p-type semiconductor substrate 21. Polycrystalline silicon 23 of 60 nm thickness, tungsten silicide 24 of 60 nm thickness and an $SiO_2$ layer 7 of 200 nm thickness are deposited successively and fabricated by using known photolithography and dry etching to form a word line of a desired pattern as a gate electrode. n-type impurity diffusion layers (P) 25, 26 are formed by ion implantation using the word line as a mask. Then, an $SiO_2$ layer of 80 nm thickness is deposited by a CVD process and fabricated by anisotropic dry etching to form an insulation film layer 28 as a side wall of the word line.

Figure 3:
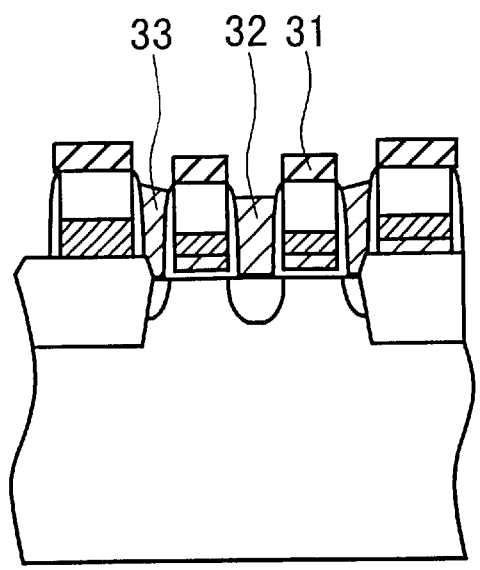
FIG. 3 is a second cross sectional view illustrating a manufacturing step for a semiconductor device of a first example according to this invention.

$Si_3N_4$ 31 of 150 nm thickness is deposited over the entire surface by using a known CVD process. Then, a portion 25 where the bit line is in contact with the n-type diffusion layer in the surface of the substrate and a portion 26 where a storage node is in contact with the n-type diffusion layer on the surface of the substrate are opened by using known photolithography and dry etching. After depositing polycrystalline silicon containing n-type impurities of 250 nm thickness by using a CVD process, etching is applied by so much as the thickness of the film, thereby burying polycrystalline silicon 32, 33 in the holes formed by the etching, to form a structure as shown in FIG. 3.

Figure 4:
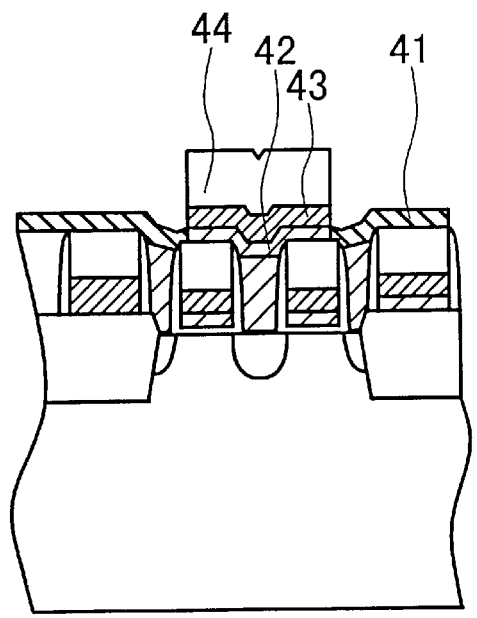
FIG. 4 is a third cross sectional view illustrating a manufacturing step for a semiconductor device of a first example according to this invention.

When, after once etching back to remove $Si_3N_4$ 31, $Si_3N_4$ 41 of 60 nm thickness is again deposited by using a known CVD process. For electric connection of the bit line with the diffusion layer 25 of the substrate, the insulation film 41 on the polycrystalline silicon 32 is opened by using known photolithography and the dry etching. Then, bit lines are formed. A polycrystalline silicon film 42 and a W/TiN/Ti laminate film 43 are used as the material for the bit line. After depositing $SiO_2$ 44 of 400 nm thickness, one-half of the film thickness is etched back, and $SiO_2$ is buried to the step to flatten. $SiO_2$ 44 and the bit line are fabricated by using known photolithography and dry etching to form bit lines of a desired pattern (FIG. 4).

Then, $SiO_2$ of 60 nm thickness is deposited by a CVD process and etched back by dry etching to form a side wall spacer 51 of $SiO_2$ on the side wall of the bit line, to insulate the bit line. Then, an insulation film 52 of silicon oxide film type such as BPSG is deposited and flattened. It is necessary that the insulation film 52 has a thickness enough to flatten the surface of the substrate. In this example, the thickness of the insulation film 52 to 500 nm and a method of flattening by etching back the film to 300 nm thickness is used.

Figure 5:
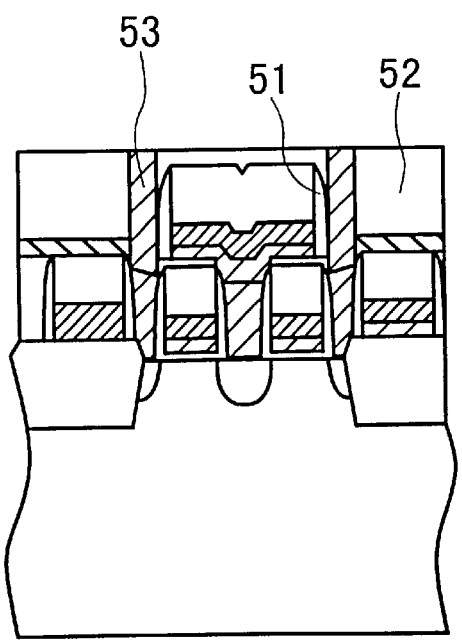
FIG. 5 is a fourth cross sectional view illustrating a manufacturing step for a semiconductor device of a first example according to this invention.

Contact holes are opened where a storage capacitors are in contact with the substrate by using known photolithography and dry etching. $Si_3N_4$ 41 above polycrystalline silicon 33 is removed by using known photolithography and dry etching. Polycrystalline silicon of 150 nm thickness is deposited by a CVD process and etched back by so much as the film thickness to bury polycrystalline silicon 53 into the contact hole (FIG. 5).

Figure 6:
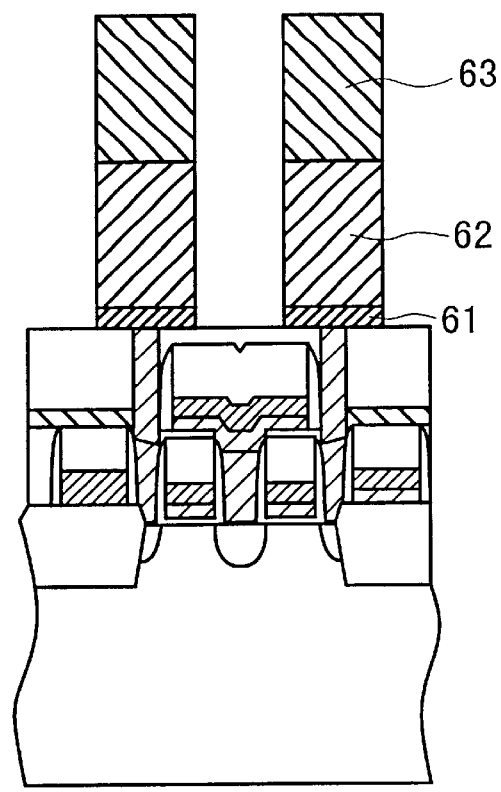
FIG. 6 is a fifth cross sectional view illustrating a manufacturing step for a semiconductor device of a first example according to this invention.
Figure 7:
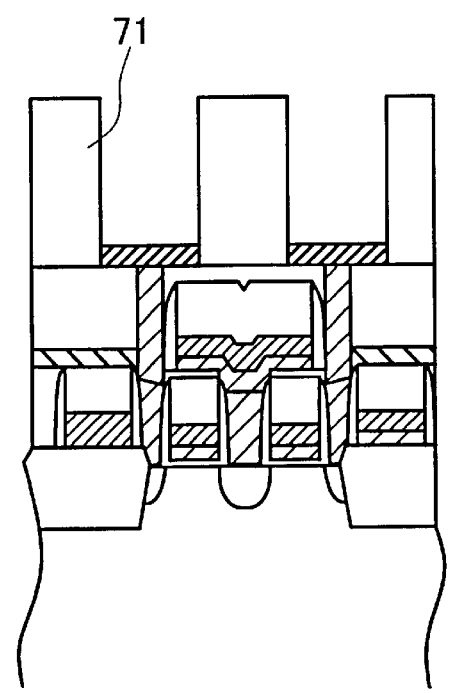
FIG. 7 is a sixth cross sectional view illustrating a manufacturing step for a semiconductor device of a first example according to this invention.

Then, TiN 61 of 50 nm thickness is deposited as a diffusion barrier layer by sputtering and, successively, a film 62 for defining a capacitor region is deposited by the thickness for the desired height of a capacitor. It is defined in this example as 0.5 μm. As the material of the film for defining the capacitor region, three methods for tungsten, $Si_3N_4$ and polycrystalline silicon have been tried to obtain good results in any of the methods in this example. A film for defining the capacitor region and the diffusion barrier layer were fabricated by using known photolithography and dry etching using a photoresist 63 as a mask (FIG. 6). In a case of using tungsten as the film for defining the capacitor region, tungsten and TiN are etched successively by using $SF_6$. In a case of using $Si_3N_4$ as the film for defining the capacitor, $Si_3N_4$ is etched by using a mixed gas of $NF_3$ and He or $O_2$ and then TiN is etched by using $SF_6$. In a case of using polycrystalline silicon as the film for defining the capacitor region, polycrystalline silicon is etched by using $SF_6$ and then TiN is etched by using $SF_6$. After etching the film defining the capacitor region and the diffusion barrier layer, the photoresist is removed by using ashing. Since the diffusion barrier layer 61 and the film 62 for forming the capacitor region such as tungsten can be etched by using the identical resist 63 as the mask, the films are patterned in self alignment.

Then, a thick insulation film 71 for burying capacitor is deposited. In this example, after depositing BPSG of 1 μm thickness by using a known CVD process, it is flattened by polishing till the film for defining the capacitor region is exposed by a known chemical mechanical polishing process (CMP). In addition to flattening by using CMP or CML (chemical mechanical lapping) as described above, it may be flattened by reflowing BPSG by heat treatment at about 850° C. and then etching back the same by about one-half of the film thickness.

Then, a film for defining the capacitor region buried in the thick insulation film is selectively removed by dry etching. In a case of using tungsten as the film for defining the capacitor region, isotropic etching with $SF_6$ is used. A selectivity ratio of 40 times or more relative to TiN as an underlayer and 20 times of more relative to the BPSG film can be obtained by selecting conditions. In a case of using $Si_3N_4$ as the film for defining the capacitor region, a mixed gas of $NF_3$ and He or $O_2$ is used. A selectivity ratio of 50 times or more relative to TiN and 10 times of more relative to the BPSG film can be obtained. In a case of using polycrystalline silicon as the film for defining the capacitor region, $SF_6$ is used. For any of the materials used, 100% over etching is applied to the film thickness so as not to leave residue in the hole as the capacitor region but underlayer etching or like other problem is not caused. A structure in which TiN as the diffusion barrier layer is present at the bottom of the hole as the capacitor region is obtained by the steps described above (FIG. 7).

Figure 8:
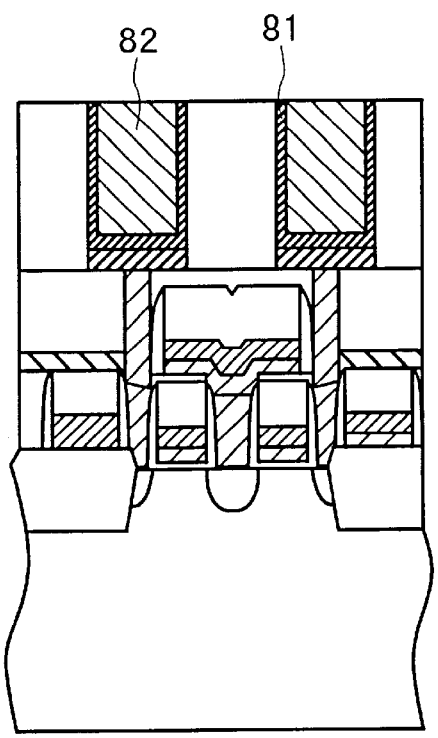
FIG. 8 is a seventh cross sectional view illustrating a manufacturing step for a semiconductor device of a first example according to this invention.

Then, ruthenium 81 of 30 nm thickness is deposited by an MOCVD process. When an organic film is coated thereon and etching is applied entirely, inside of the hole is buried with an organic film 82 but ruthenium is exposed on the surface of the insulation film 63. The exposed ruthenium is etched to isolate bottom electrodes on every cells (FIG. 8).

Figure 9:
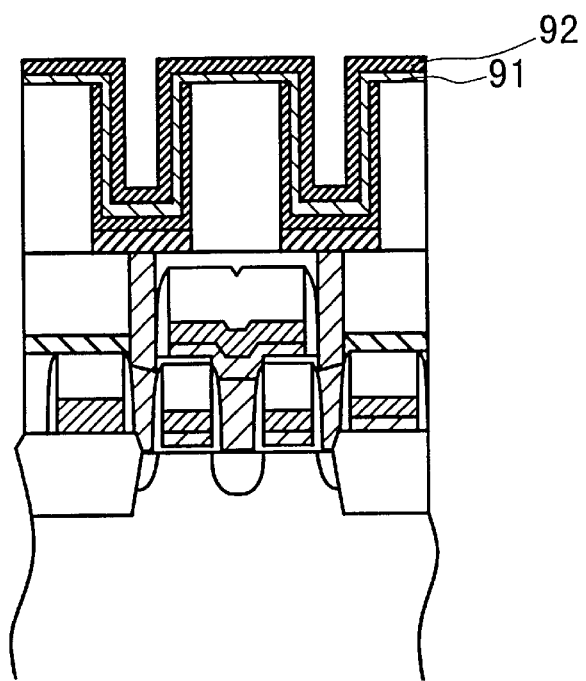
FIG. 9 is an eighth cross sectional view illustrating a manufacturing step for a semiconductor device of a first example according to this invention.

After removing the organic film 82, strontium barium titanate 91 of 20 nm thickness as a high dielectric permittivity film and ruthenium dioxide 92 of 20 nm thickness as a plate electrode are successively deposited by an MOCVD process (FIG. 9).

Instead of entirely etching the organic film, when a pattern is formed by photolithography such that ruthenium 81 on the flatten insulation film is not etched, a capacitor can be prepared to the outside of the memory mat. While an MOS capacitor of large area is used, for example, as a by-pass condenser in LSI, since this capacitor uses the high dielectric permittivity film, an identical capacitance can be obtained with much smaller area, so that the chip area can be decreased by using this capacitor.

Figure 22:
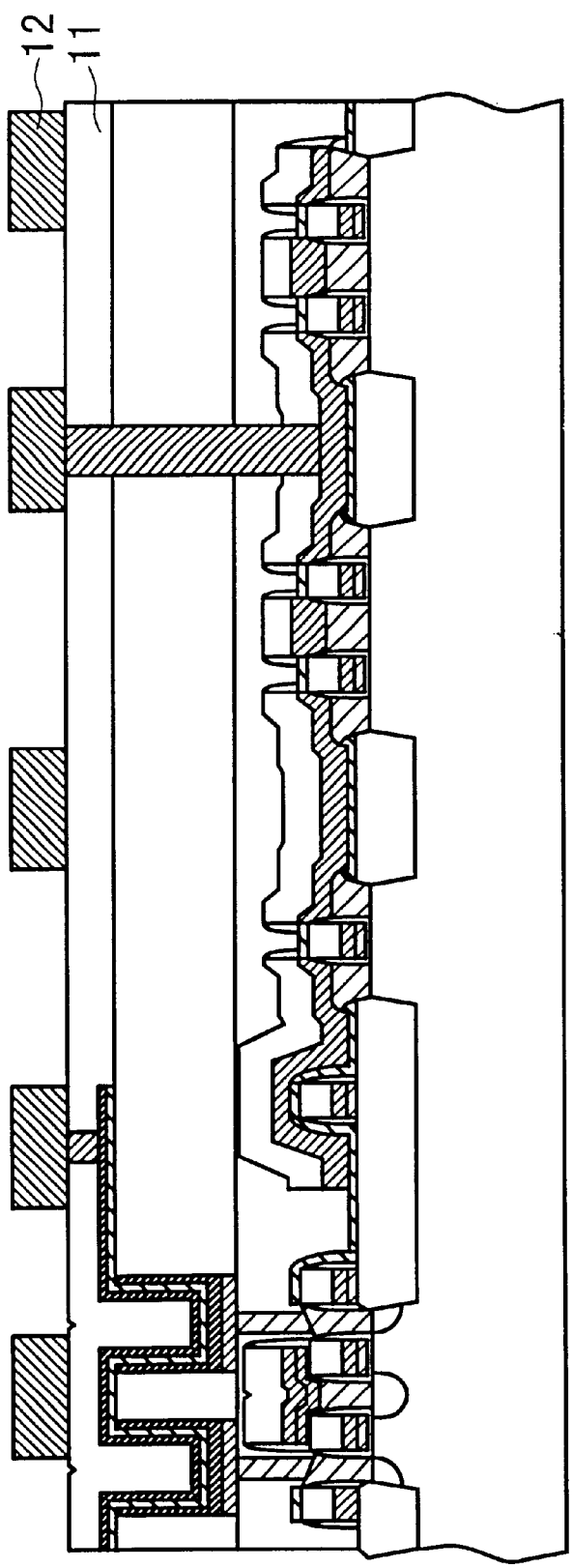
FIG. 22 is a cross section of a main portion for each portion of a memory cell array according to this invention and a peripheral circuits in adjacent therewith.
Figure 23:
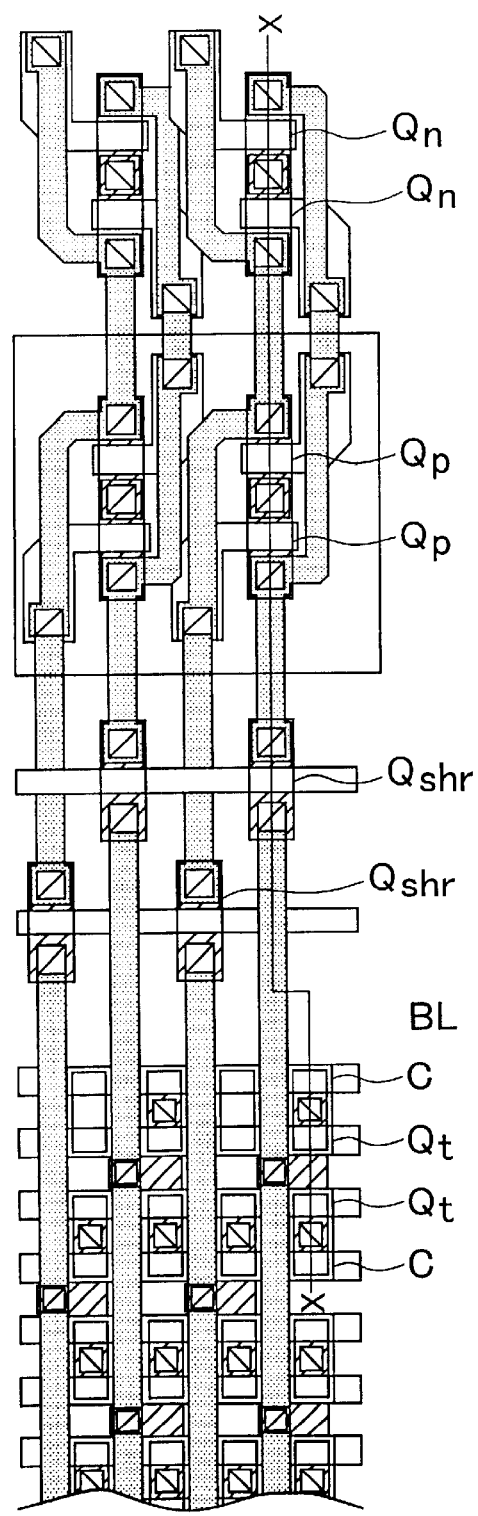
FIG. 23 is a plan view for each portion of a memory cell according to this invention and peripheral circuits.
Figure 24:
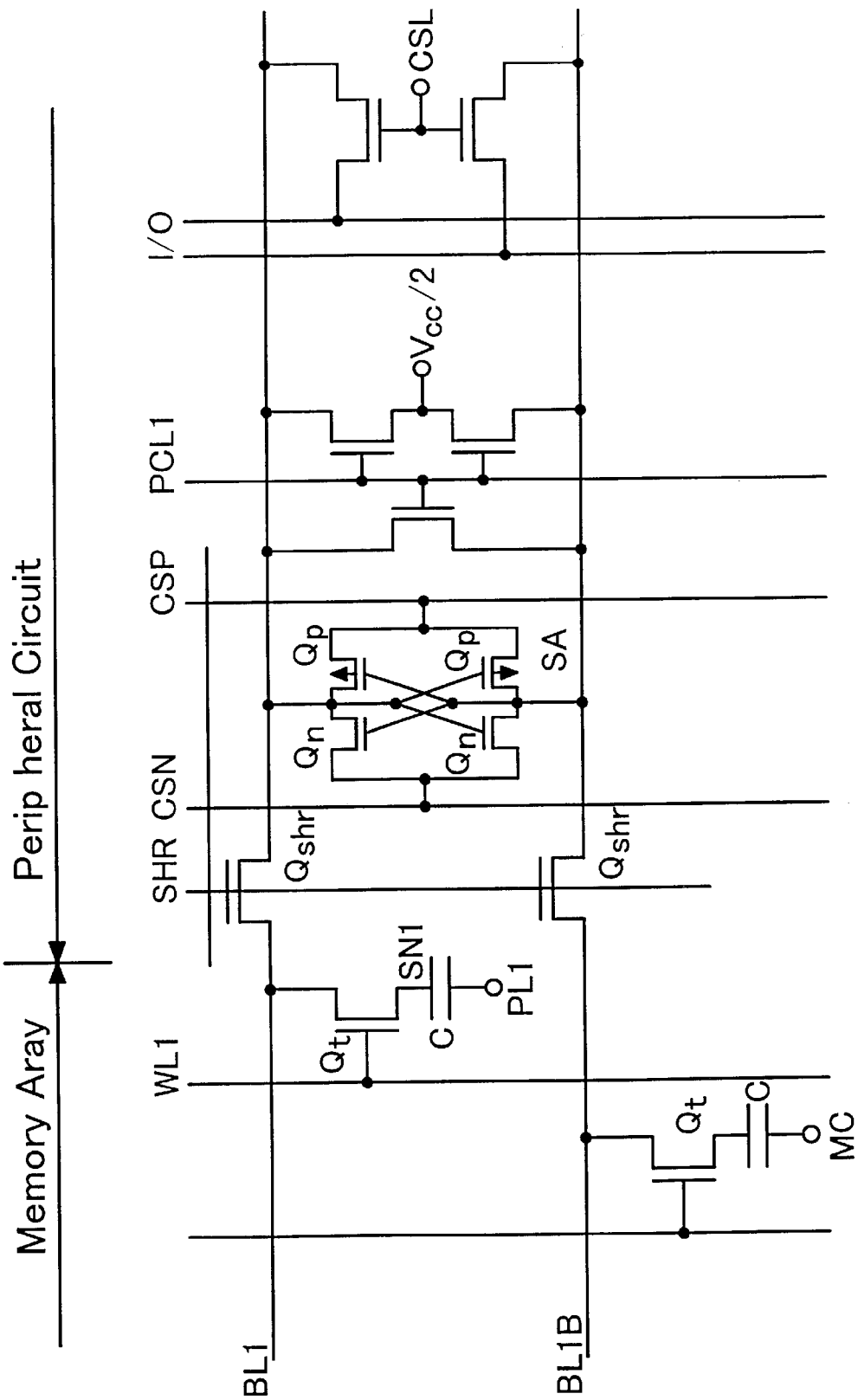
FIG. 24 is a circuit diagram for each portion of a memory cell and peripheral circuits according to this invention.
Figure 25:
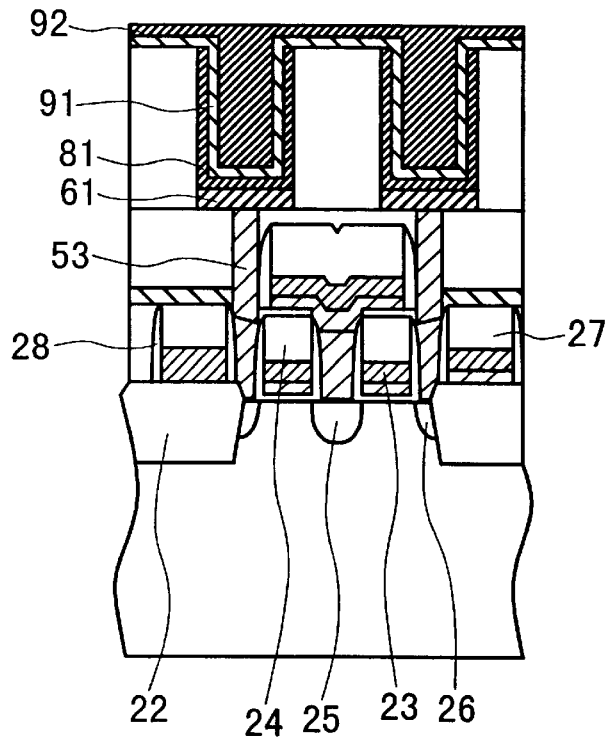
FIG. 25 is a cross sectional view of an existent semiconductor device.
Figure 26:
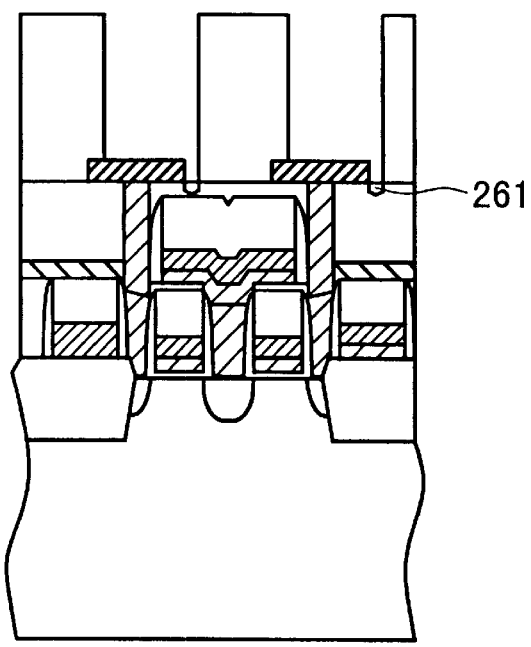
FIG. 26 is a view explaining a problem in the existent semiconductor device.

Then, after removing ruthenium dioxide and strontium barium titanate at unnecessary portion of the plate electrode outside of the memory mat by using the photoresist as a mask, an ozone TEOS 11 of 400 nm thickness is deposited by a CVD process and etched back by one-half of the film thickness to flatten the portion on the capacitor region. A contact hole for connecting the plate electrode and the upper electrode of the capacitor is opened by using known photolithography and dry etching and a second metal wiring layer 12 is formed to complete a memory cell as shown in FIG. 22. FIG. 22 shows a cross section of a main portion for each portion of a memory cell array section and peripheral circuits adjacent therewith. FIG. 23 is a plan view for each portion of a memory cell according to this invention and peripheral circuit, and FIG. 24 is a circuit diagram showing a memory cell according to this invention and each portion of peripheral circuits. FIG. 22 is a cross sectional view taken along line X–X' in FIG. 23. FIG. 22 shows a memory cell selecting MISFET $Q_1$ and MISFET of peripheral circuits attached with symbols $Q_{shr}$, $Q_p$, $Q_n$, in FIG. 23 and FIG. 24. $Q_{shr}$ is a sheared MISFET for isolating the memory cell portion of DRAM and a sense amplifier in peripheral circuit sections. $Q_p$ represents a p-channel MISFET and $Q_n$ is an n-channel MISFET, and the sense amplifier portion constitutes a flip-flop circuit comprising each two $Q_p$ and $Q_n$.

EXAMPLE 2

Figure 10:
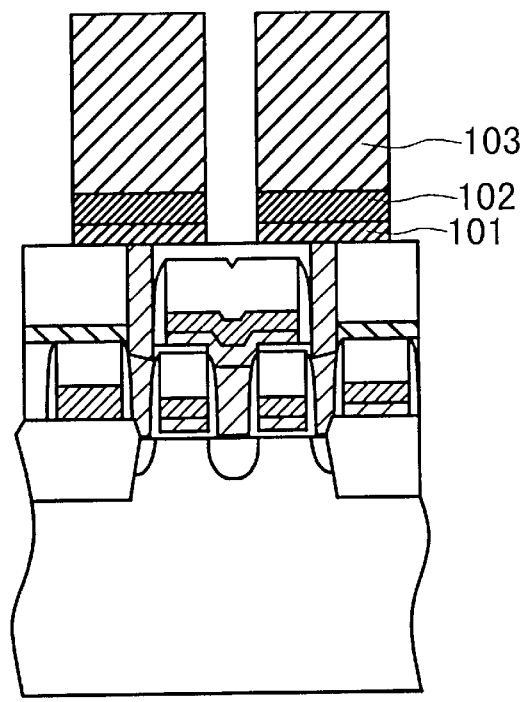
FIG. 10 is a first cross sectional view illustrating a manufacturing step for a semiconductor device of a second example according to this invention.

A second example of this invention is to be explained with reference to FIG. 10 to FIG. 13. In this example, a lower electrode is previously formed and then an interlayer insulation film is formed. It is identical with Example 1 up to the process of obtaining a structure in which polysilicon is buried in the contact hole for connecting the memory cell capacitor and the switching transistor as shown in FIG. 5. Then, as shown in FIG. 10, TiN 101 of 50 nm thickness and a Ru film 102 of 60 nm thickness are successively deposited by sputtering. The thickness of the Ru film 102 is preferably made larger than the thickness of a Ru film 121 so as not to cause conduction failure when the Ru film 121 forming the side wall for the lower electrode is etched back subsequently even if it is etched somewhat.

Figure 32:
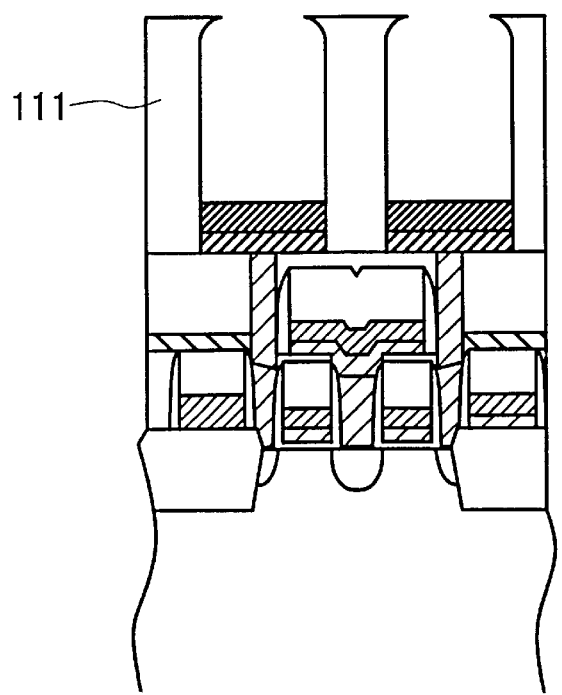
FIG. 32 is a cross sectional view illustrating a manufacturing step of a semiconductor device of Example 2 according to this invention.

Successively, tungsten is deposited as a film 103 for defining the capacitor region by a thickness for the desired height of the capacitor. It is 450 nm in this example. W is fabricated using a photoresist as a mask using known photolithography and dry etching, the photoresist is removed and then Ru 102 and TiN 101 are successively fabricated using W 103 as a mask to obtain a structure shown in FIG. 10. In the same manner as in Example 1, a thick oxide film 111 is deposited and flattened by a CMP process. Fumed silica is used as a slurry in CMP. Since the polishing selectivity ratio between the oxide film and W is ten times or more, an end point can be detected easily. Since the polishing rate shows ±5% of in-plane distribution, after polishing till W is exposed, polishing is conducted by adding 10%. In the step, W is exposed over the entire wafer surface and the film thickness is 0.4 $\mu$m at the minimum. Further, since the W film 103 is used as the mask upon dry etching fabrication of Ru/TiN, the upper corners thereof are removed. If it is buried in the shape as it is into the oxide film 111 and W is removed, the oxide film forms an overhung state above the hole at a portion as a capacitor region as shown in FIG. 32 making it difficult to form the lower electrode and the capacitor insulation film in the hole. A hole of a vertical shape can be obtained by scraping off corner erosion of the W film 111 upon flattening by the CMP process.

Figure 11:
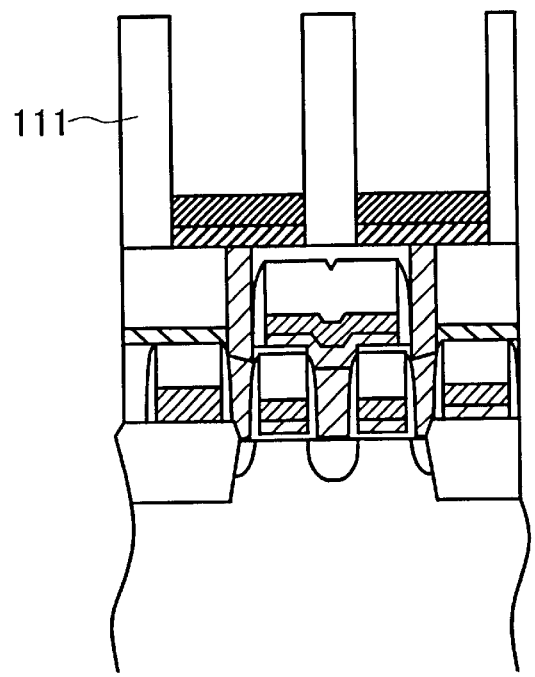
FIG. 11 is a second cross sectional view illustrating a manufacturing step for a semiconductor device of a second example according to this invention.
Figure 12:
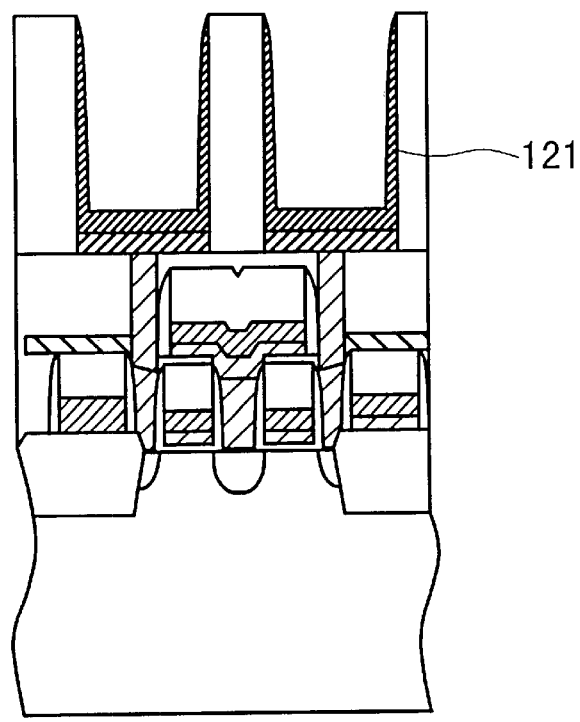
FIG. 12 is a third cross sectional view illustrating a manufacturing step for a semiconductor device of a second example according to this invention.

Then, a structure shown in FIG. 11 is obtained by removing W 103 by dry etching. Then, a Ru film 221 of 50 nm thickness is deposited by long throw sputtering of excellent burying characteristic and etched back by so much as the film thickness to obtain a structure in which Ru covers the side wall of the hole as the capacitor region and the lower electrode is isolated on every capacitors (FIG. 12). In this example, since the Ru film 102 is previously laid at the bottom for the lower electrode and the lower electrode is isolated on every capacitors by etching back, it has a merit of reducing the number of steps compared with Example 1.

Figure 1:
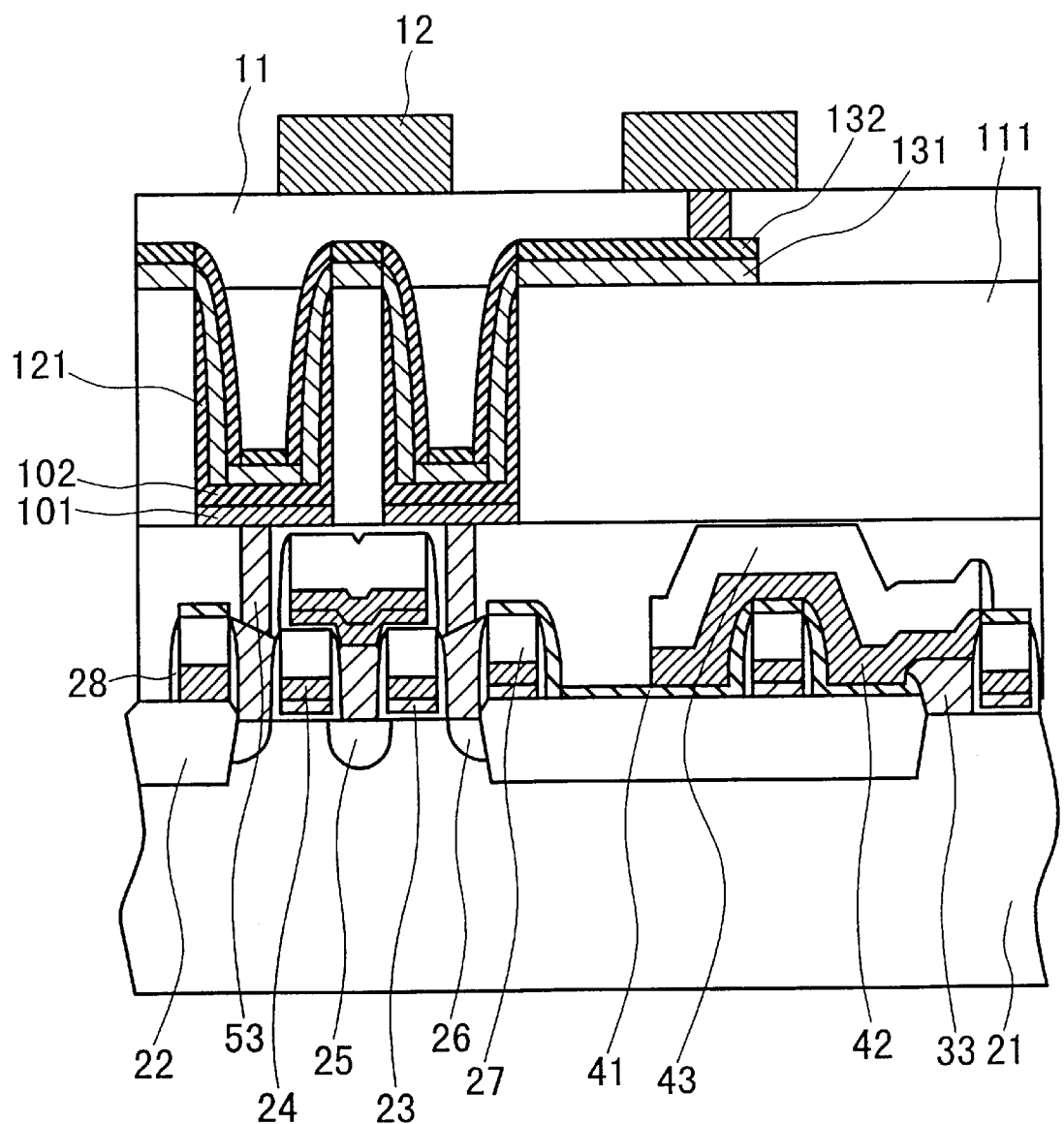
FIG. 1 is a cross sectional view of a semiconductor device according to this invention.
Figure 13:
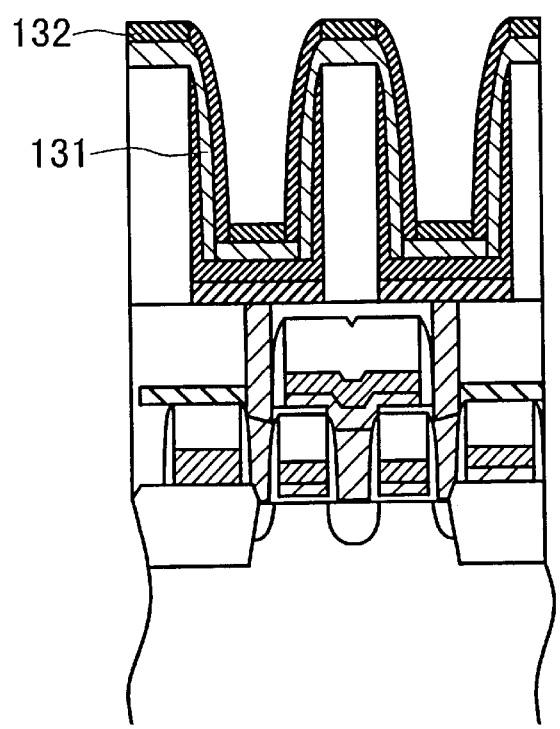
FIG. 13 is a fourth cross sectional view illustrating a manufacturing step for a semiconductor device of a second example according to this invention.

Then, as shown in FIG. 13, strontium barium titanate 131 of 30 nm thickness and ruthenium dioxide 132 of 20 nm thickness are successively deposited by an MOCVD process. After removing ruthenium dioxide and strong barium titanate at unnecessary portion of the plate electrode outside of the memory mat by using a photoresist as a mask, wiring is conducted to complete a memory cell as shown in FIG. 1.

EXAMPLE 3

In Examples 1 and 2, the film for defining the capacitor region is removed in the subsequent step. If it is used as the wiring layer, fabrication for deep contact holes due to the step between the peripheral circuit and the memory mat can be saved to obtain a device of high reliability. Manufacturing steps of a device using such a method is to be explained with reference to FIG. 14 to FIG. 19.

Figure 14:
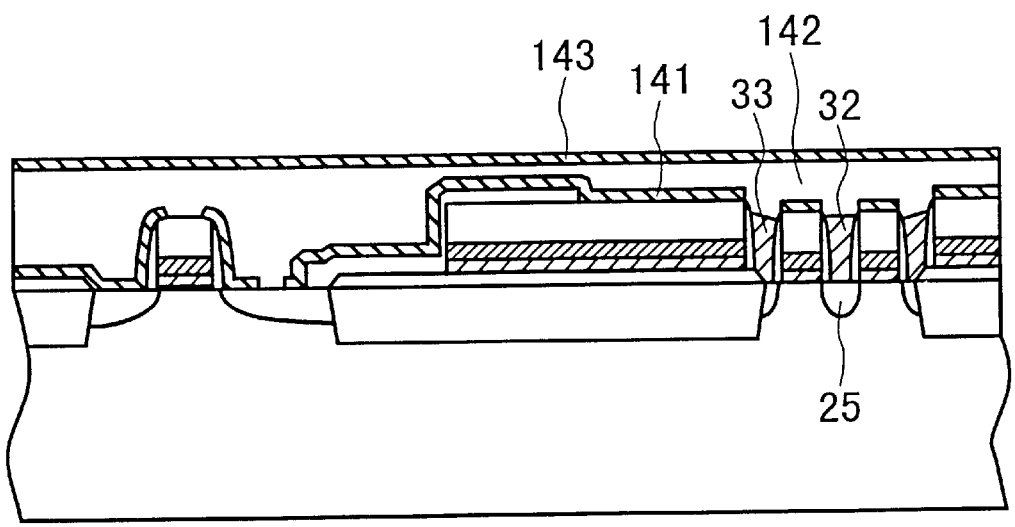
FIG. 14 is a first cross sectional view illustrating a manufacturing step for a semiconductor device of a third example according to this invention.

This is identical with Example 1 till the structure shown in FIG. 3 is obtained. Then, after once removing $Si_3N_4$ 31 by etching back, $Si_3N_4$ 141 of 40 nm thickness is deposited by using a known CVD process as shown in FIG. 14. For electric connection of a bit line with a diffusion layer 25 of the substrate, the insulation film 14 above the polycrystalline silicon 32, 33 is removed by using known photolithography and dry etching. At the same time, the insulation film 141 covering the contact portion in the peripheral circuits is also removed by using a known photolithography and dry etching. After depositing $SiO_2$ 141 of 300 nm thickness by using known CVD process, it is flattened by a CMP process. Then, $Si_3N_4$ 143 of 40 nm thickness is deposited by using a known CVD process.

Figure 15:
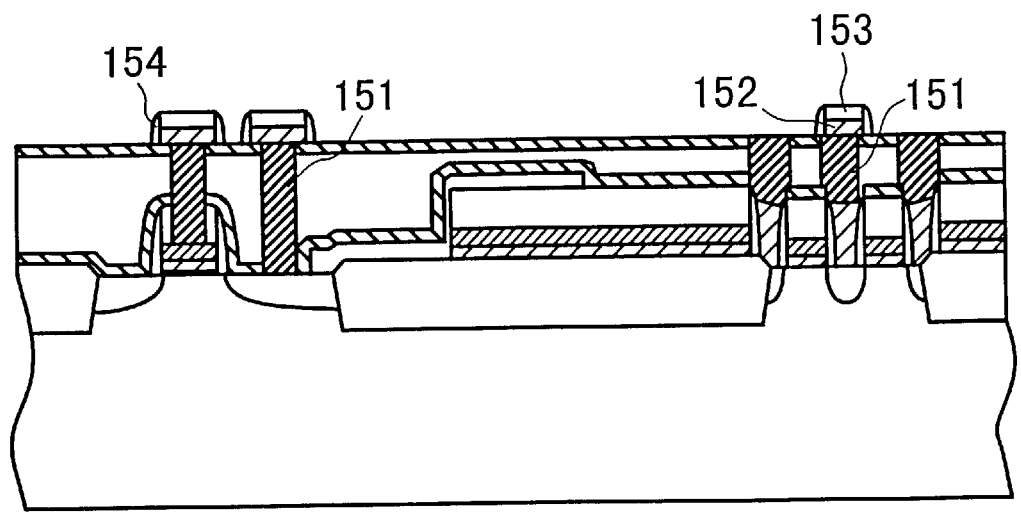
FIG. 15 is a second cross sectional view illustrating a manufacturing step for a semiconductor device of a third example according to this invention.

Contact holes to polycrystalline silicon 32, 33 and peripheral circuits are opened by using known photolithography and dry etching. TiN of 100 nm thickness is deposited by a CVD process and TiN 151 is buried into the contact holes by a CMP process. Then, as shown in FIG. 15, a first wiring layer is formed a W/TiN/Ti laminate film 152 is used as the material. The W/TiN/Ti laminate film is deposited by sputtering and, after depositing $SiO_2$ 135 of 50 nm thickness thereon, it is fabricated by using known photolithography and dry etching to form the first wiring layer into a desired pattern. The first wiring layer is used for the wirings of bit lines and peripheral circuits. $SiO_2$ of 50 nm thickness is deposited by a CVD process and etched back by dry etching and a $SiO_2$ side wall spacer 154 is formed on the lateral wall of the first wiring layer, to insulate the first wiring layer.

Then, an insulation film 161 of a silicon oxide type such as BPSG is deposited and flattened. In this example, the thickness of the insulation film 161 is 250 nm and it is flattened by a CMP process. Storage node contact holes for connecting a storage capacitor and a diffusion layer are opened by using known photolithography and dry etching. At the same time, contact holes for connecting the first wiring layer and the second wiring layer are also opened. Polycrystalline silicon of 100 nm thickness is deposited by a CVD process and etched back by the film thickness to bury the contact holes with polycrystalline silicon 162. Further, polycrystalline silicon 163 of 50 nm thickness is deposited for flattening by a CVD process.

Figure 16:
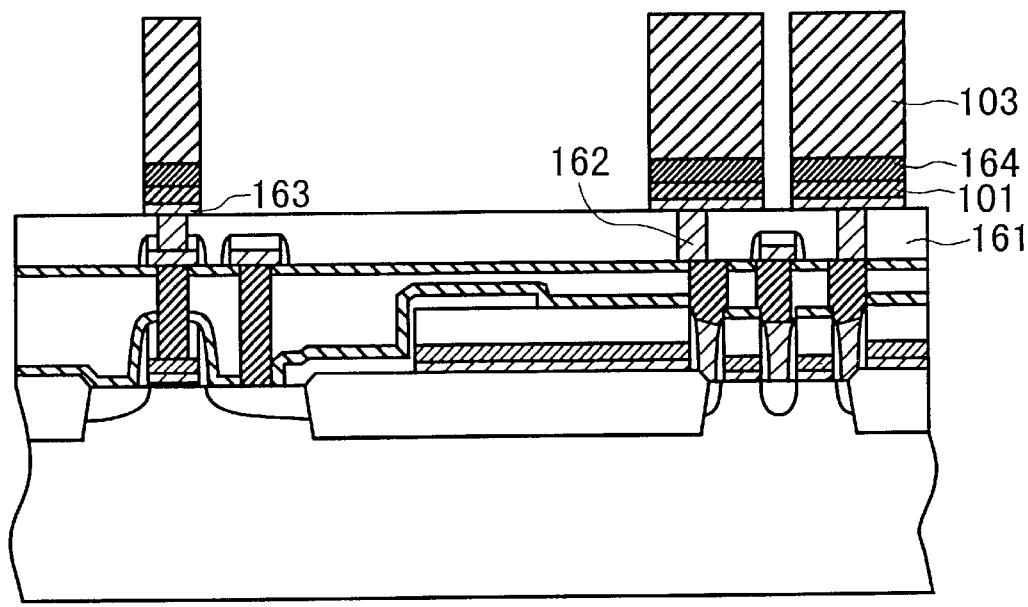
FIG. 16 is a third cross sectional view illustrating a manufacturing step for a semiconductor device of a third example according to this invention.

Then, TiN 101 of 50 nm thickness and an Ru film 164 of 60 nm thickness are deposited successively by sputtering and, successively, tungsten is deposited as a film 103 for defining a capacitor region by a film thickness for a desired height of the capacitor. In this example, it is 0.5 μm. W 103, Ru 164 and TiN 101 are successively patterned using a photoresist as a mask by using known photolithography and dry etching to obtain a structure shown in FIG. 16. This is different from Example 2 in that W/Ru/TiN is utilized also for the connection between the first wiring layer and the second wiring layer as shown in FIG. 16.

Figure 17:
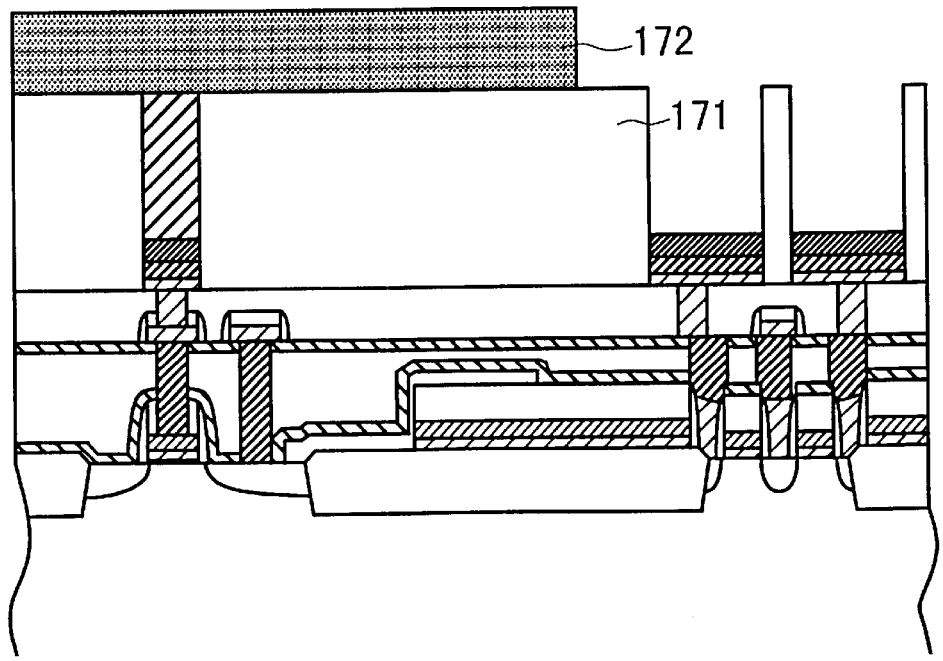
FIG. 17 is a fourth cross sectional view illustrating a manufacturing step for a semiconductor device of a third example according to this invention.

Then, a thick oxide film 171 is deposited and flattened and then W is removed to obtain a structure shown in FIG. 17. In this case, the outside of the memory mat section is covered with a photoresist 172 and W/Ru/TiN used as the wirings for the peripheral circuits are left.

Figure 18:
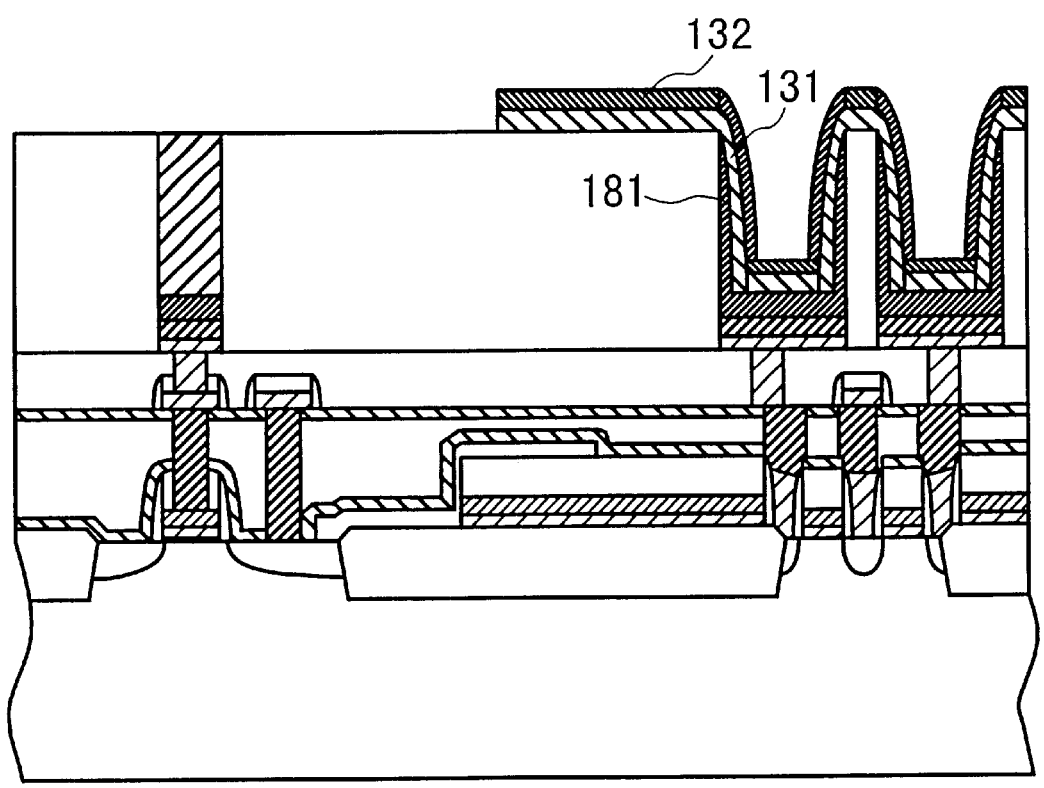
FIG. 18 is a fifth cross sectional view illustrating a manufacturing step for a semiconductor device of a third example according to this invention.
Figure 19:
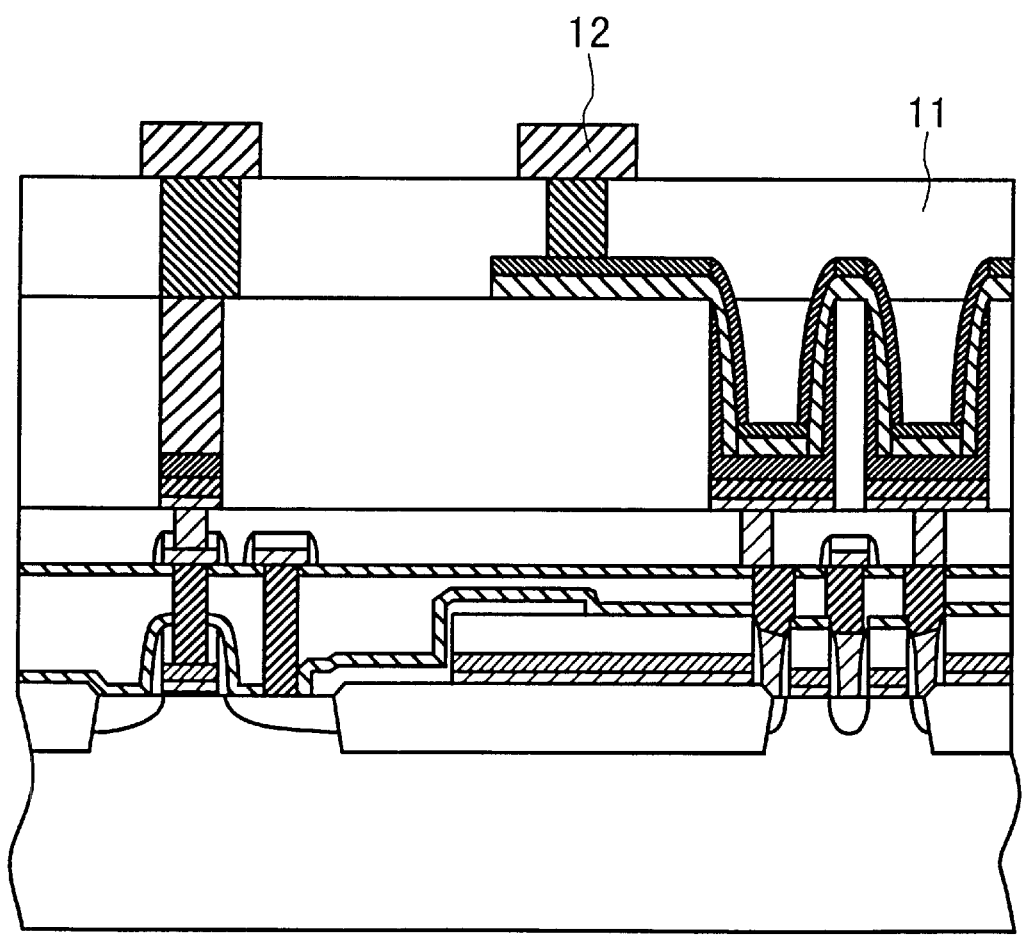
FIG. 19 is a sixth cross sectional view illustrating a manufacturing step for a semiconductor device of a third example according to this invention.
Figure 20:
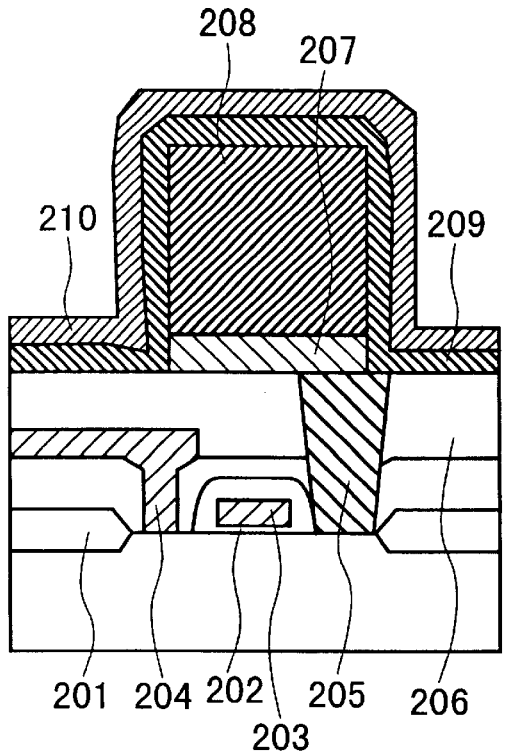
FIG. 20 is a cross sectional view of an existent semiconductor device.
Figure 21:
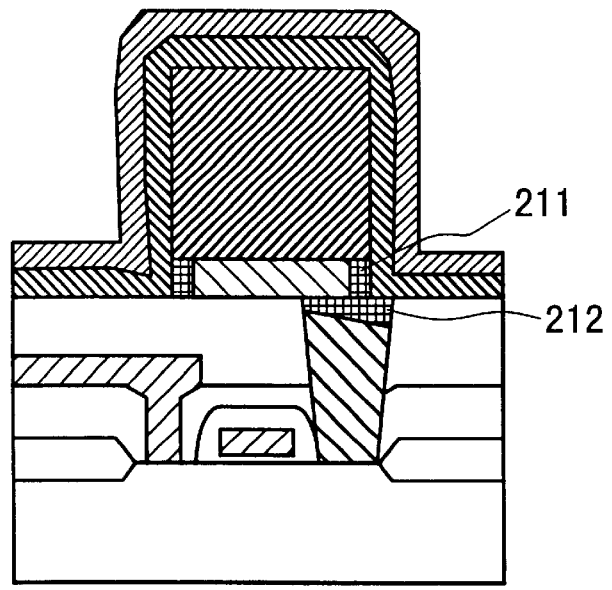
FIG. 21 is a drawing for explaining a problem in the existent semiconductor device.

Then, in the same manner as in Example 2, an Ru film 181 of 50 nm thickness is deposited by long throw sputtering of excellent coverage characteristic and then etched back by so much as the film thickness to obtain a structure in which Ru covers the side wall for the hole as the capacitor region, and the lower electrode is isolated on every capacitors. Then, as shown in FIG. 18, strontium barium titanate 131 of 30 nm thickness and ruthenium dioxide 132 of 20 nm thickness are successively deposited by an MOCVD process. After removing ruthenium dioxide 132 and strontium barium titanate 131 at unnecessary portion of the plate electrode outside of the memory mat using the photoresist as a mask, wirings are conducted to complete a memory cell as shown in FIG. 19. In Examples 1 and 2, when the height of the memory capacitor is increased for finer arrangement, since the depth of the contact hole for the peripheral circuit is increased, conduction failure or like other problem tends to be caused. Further, since a step between the peripheral circuit and the memory cell section increases, a possibility of causing wiring failure also increases at the step. In this example, since W/Ru/TiN is used for the wirings to the peripheral circuit, if the height of the memory cell capacitor increases, wirings and contact with the peripheral circuit are conducted reliably, which is suitable for refinement. While Ru is used as the lower electrode material in this example, it will be apparent that Pt or Ir may also be used. Further, in this embodiment, the film 103 for defining the capacitor region is formed after forming the diffusion barrier layer and the lower electrode, but the lower electrode may be formed after forming and fabricating the film 103 for forming the capacitor region on the diffusion barrier layer as in Example 1

EXAMPLE 4

Figure 27:
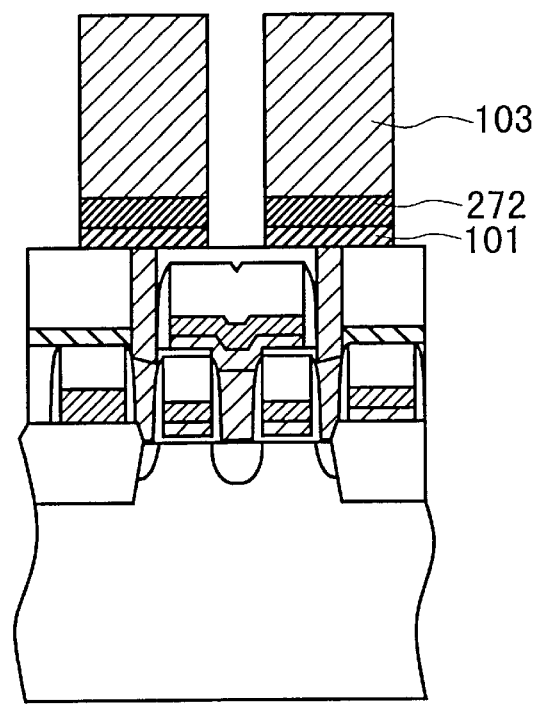
FIG. 27 is a first cross sectional view illustrating a manufacturing step for a semiconductor device of a fourth example according to this invention.

A fourth example of this invention is to be explained with reference to FIG. 27 to FIG. 29. In this example, a platinum electrode is formed on the side wall by a plating method. This is identical with Example 1 to the process of obtaining a structure in which polysilicon is buried in contact holes for connecting the memory cell capacitor and the switching transistor. Then, as shown in FIG. 27, TiN 101 of 50 nm thickness and a Pt film 272 of 30 nm thickness are successively deposited by sputtering.

Successively, tungsten is deposited as a film 103 for defining the capacitor region by a film thickness for a desired height of the capacitor. In this example, it is 450 nm. W is patterned using a photoresist as a mask by using known photolithography and dry etching and, after removing the photoresist, Pt 272 and TiN 101 are successively etched using W 103 as a mask to obtain a structure shown in FIG. 27. In the same manner as in Example 2, a thick oxide film 111 is deposited and flattened by a CMP process.

Figure 28:
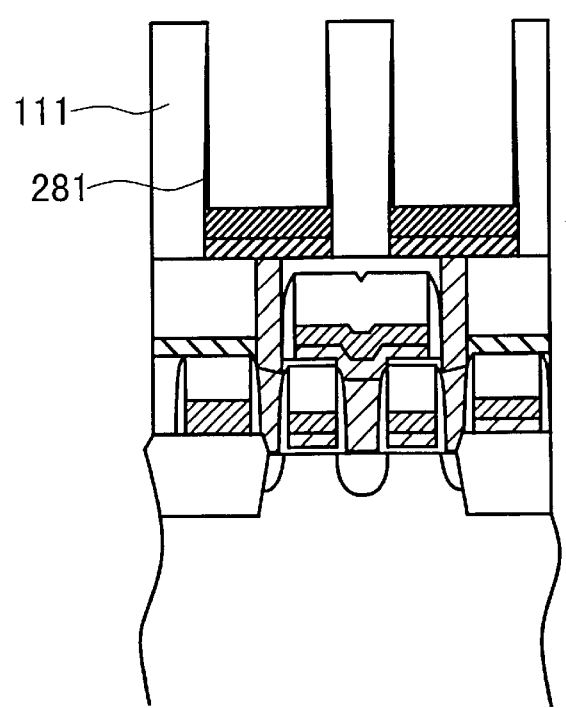
FIG. 28 is a second cross sectional view illustrating a manufacturing step for a semiconductor device of a fourth example according to this invention.
Figure 29:
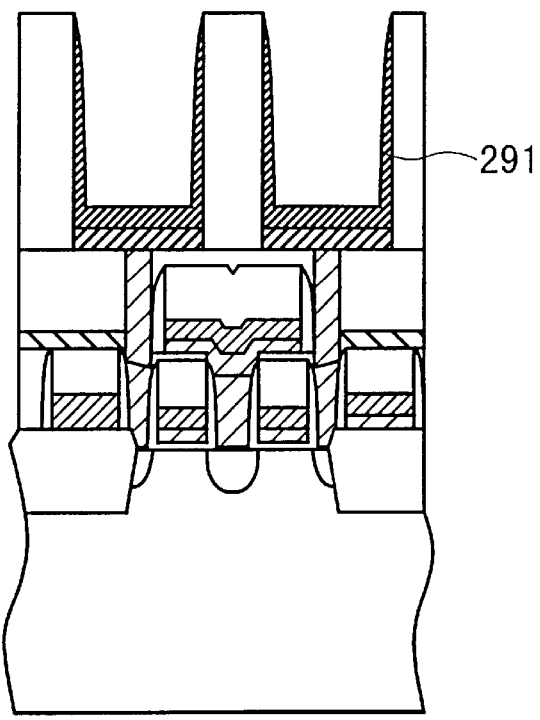
FIG. 29 is a third cross sectional view illustrating a manufacturing step for a semiconductor device of a fourth example according to this invention.

Then, W is removed by dry etching to obtain a structure shown in FIG. 28. Then, a Pt film 291 of 30 nm thickness is formed on the side wall of the hole as the capacitor region by electroless plating. Since the Pt film 272 functions as seeds, a lower electrode can be formed selectively only to the inside of the hole (FIG. 29). When Pt is intended to be fabricated by using a vertical mask, Pt deposits on the side wall of the mask tungsten upon dry etching, and a thin Pt wall 281 remains on the side wall of the hole as the capacitor region after removing W and, since the Pt film on the side wall also functions as a seed layer upon plating, it also provides an effect of improving the selectivity of plating.

Subsequently, a memory cell is completed in the same manner as in Example 2.

Figure 30:
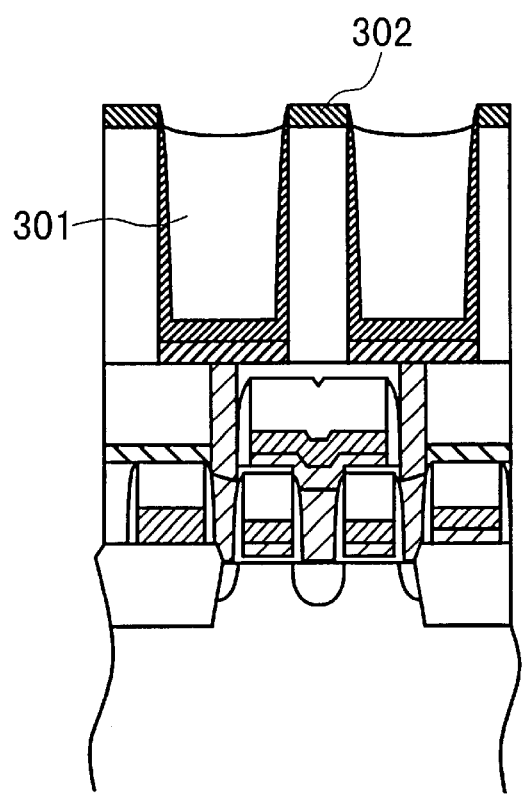
FIG. 30 is a fourth cross sectional view illustrating a manufacturing step for a semiconductor device of a fourth example according to this invention.
Figure 31:
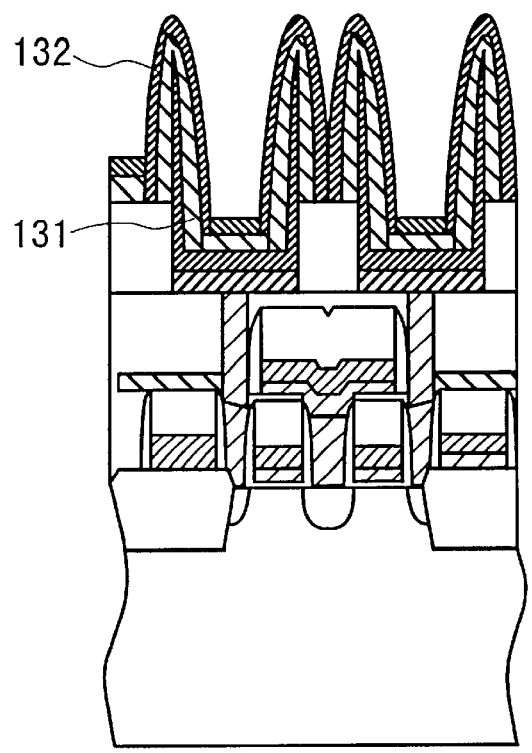
FIG. 31 is a cross sectional view illustrating a manufacturing step got a semiconductor device of an example according to this invention.

There is a method of forming the Pt film also on the plane above the hole as shown in FIG. 30 by using conditions so as not to give selectivity ratio of the plating. In this case, an organic film 301 is coated in the same manner as in Example 1 and, after conducting entire etching, exposed Pt is etched to isolate the bottom electrode on every cells at 302. Further, when a method of coating an $SiO_2$ film instead of the organic film 301 and isolating the bottom electrode on every cells, and then removing the $SiO_2$ film by dry etching is used, a capacitor dielectric film 131 is disposed on both surfaces of the lower electrode and a platinum electrode 132 can be disposed on the surface thereof to obtain a structure as shown in FIG. 31. In this structure, since both surfaces of the Pt electrode can be used in a portion of the capacitor, this provides a merit capable of obtaining a larger capacitance. Also in this case, the film for the capacitor region may be formed either before or after the formation of the platinum lower electrode.

In this example, strontium barium titanate is used for the capacitor dielectric film, it will be apparent that the material for high dielectric permittivity thin film is not restricted only to strontium barium titanate but it may be, for example, perovskite-type oxide ferroelectrics such as lead zirconate titanate, strontium titanate and barium titanate, solid solutions thereof, tantalum oxide, or bismuth-layered oxide ferroelectrics.

Further, a reading operation of using the memory according to this invention as DRAM is to be explained with reference to a circuit diagram shown in FIG. 23. The potential on a plate electrode PL1 of a capacitor is always fixed at Vcc/2. On the other hand, a volatile data Vcc or 0 is held at a storage node SN1. The potential on bit line pair BL1 and BL1B are held at Vcc/2 just before the reading or writing operation. A sense amplifier SA for detecting and amplifying the stored data is connected to the bit line pair. At first, for detecting the storage voltage at the storage node SN1, the potential on a precharge control line PCL1 is lowered from Vcc to 0, and the bit line is put in a floating state at potential Vcc/2. At the same time, a sheared MISFET $Q_{shr}$ is turned on. Then, the potential on a word line WL1 is increased from 0 to Vch. Vch is a potential higher than Vcc at least by a threshold voltage of a transistor. As a result, when the potential on the storage node has been Vcc, the potential on the bit line BL1 rises somewhat higher than the potential on BL1B, that is, Vcc/2 and, when it has been at 0, the potential on BL1 changes somewhat lower compared with BL1B. By detecting and amplifying the potential difference by the sense amplifier SA1, the potential on BL1 is Vcc or 0 being identical with the potential on the storage node. For operating the sense amplifier, a sense amplifier p-channel transistor control line CSP and a sense amplifier n-channel transistor control line CNS may be put to Vcc and 0, respectively. With the operations described above, data in all of the memory cells connected with the selected word line WL1 are read out to each of the connected bit lines. For externally reading out the data of one of the memory cells selectively by way of the IO line, the potential on the sense amplifier selection line CSL1 may be set from 0 to Vch and a desired bit line may be connected to the IO line. For ending the reading operation, making the line WL1 returned to zero after returning the potential on CSL1 from Vch to 0, the storage node SN1 is electrically isolated from the bit line in a state of written with the data. When returning PCL1 to Vcc and SCP and CSN to 0 and Vcc respectively, the state before reading operation is attained and the operation is ended.

Then, reading and writing procedures in a case of using the memory according to this invention as a ferroelectric non-volatile memory is to be explained with reference to JP-A No. Hei 7-21784.

Referring at first to the reading operation, this is identical with the case of DRAM described previously.

In the data writing in a ferroelectric non-volatile memory, reversion of polarization for the ferroelectric film is conducted simultaneously with the potential switching for the storage node SN1. The writing operation, identical with the reading operation from lowering the signal line PCL1 from Vch to 0 to the operation of the sensing amplifier. Then, for writing the data prepared on the IO line into the memory cell, the potential on the signal line CLS1 is rised from 0 to Vch. As a result, the potential on the bit line pair BL1 and BL1B is switched. Since the word line WL1 is in an activated state, the storage node potential and the polarization direction in the ferroelectric film in the desired memory cell are reversed. After writing data in this way, the writing operation is ended by the same procedures as those in the reading operation. According to such reading and writing procedures, since the volatile data and the non-volatile data are always written in parallel, the data is not lost whenever the power supply is turned off.

Then, conversion operation from the non-volatile data to the volatile data upon turning on of the power source in the ferroelectric non-volatile memory is to be explained. Before turning on the power supply, potentials are at 0 V in each of the portions. When the power source is turned on, they are initialized as the plate PL1 to Vcc/2 and the signal lines CSP, CSN of the sense amplifier to 0 and Vcc respectively. Further, the potential on the signal line PCL rises from 0 to Vcc and, as a result, the potential on the bit line pair BL1, BL1B is precharged to Vcc/2. In this case, the word line potential is held at 0 V and the storage node SN1 is put to a floating state, so that the direction of polarization of the ferroelectric film is not destructed upon plate boosting. When the pontentials on the plate PL1 and the bit line pair BL1 and BL1B are reliably stabilized at the potential Vcc/2, the word lines WL are activated successively and the storage node SN1 is put to the same potential Vcc/2 as the plate PL1 to more stably held the polarization data. Succeeding to the initializing operations described above, it goes to the conversion operation from the non-volatile data to the volatile data. At first, in a state where all the word lines are at 0 V, the potential on PCL1 is put to 0 V and the bit line is put to the floating state. Then, the bit line is precharged to 0 V and again put to the floating state. Subsequently, when the word line WL1 is activated, current flows from the storage node SN1 to the bit line to rise the potential on the bit line. The rising amount depends on the polarization direction of the ferroelectric film. That is, since the plate potential is higher also after boosting the bit line potential, the polarizing direction is aligned to one direction. An effective capacitance of ferroelectric is larger in a case of reversion of the polarization by the activation of the word line compared to a case with no reversion and, as a result, the potential rising amount of the bit line is larger. A dummy cell generating an intermediate value of the potential rising amount corresponding to the two polarization states to the complementary bit line BL1B is disposed, and the potential difference between the bit line pair BL1 and BL1B is detected and amplified by the sense amplifier SA1. As a result that the potential on the bit line is charged to Vcc or 0 by the action of the sensing amplifier, volatile data is written into the storage node SN1. Finally, after inactivating the word line, the potential on the bit line is returned to Vcc/2 to complete a series of operations. When the operations described above are conducted successively to each of the word lines, conversion from the non-volatile data to the volatile data is completed. According to this procedures, since polarization in the ferroelectric film is reversed accompanied by the data reading operation only upon turning on of the power source, degradation of the ferroelectric film can be decreased. Further, the reading speed is not lowered due to the time required for the reversion of the polarization during usual use. Moreover, the data at the timing of turning off the power source is stored, and such data can be regenerated when the power source is turned on next.

Industrial Applicability

This invention is used to a dynamic random access memory having mosfet as constituent elements or also to integrated circuits integrated on one chip such as high dielectric permittivity capacitor, or ferroelectric non-volatile memory.

What is claimed is:

1. A semiconductor device comprising
    a substrate in which a switching transistor is formed,
    a first conductive film formed on the substrate,
    a diffusion barrier layer formed at the bottom of an opening in an insulation film on the first conductive film and
    a capacitor extended from a portion on the diffusion barrier layer to the lateral side of the opening and having a first electrode formed in self alignment with the diffusion barrier layer.

2. A semiconductor device as defined in claim 1, wherein the insulation film of the capacitor comprises perovskite type oxides.

3. A semiconductor device as defined in claim 2, wherein the perovskite type oxides are one of strontium barium titanate, strontium titanate, barium titanate, lead zirconate titanate and barium lead zirconate titanate.

4. A semiconductor device as defined in claim 1, wherein the insulation film of the capacitor comprises tantalum pentoxide.

5. A semiconductor device as defined in claim 1, wherein the diffusion barrier layer has at least one layer of Ti, Ta, TiN, $Al_xTi_{1-x}N$ and Ru.

6. A semiconductor device comprising
    a substrate in which a switching transistor is formed,
    a first insulation film formed on the substrate and having a first opening,
    a first conductive film disposed in the first opening and connected electrically with the diffusion layer of the transistor,
    a second insulation film formed on the first insulation film and having a second opening,
    a diffusion barrier layer formed at the bottom of the second opening, and
    a capacitor disposed from a portion on the diffusion barrier layer to the lateral side of the second opening in which the lateral side is patterned substantially identically with the diffusion barrier layer.

7. A semiconductor device as defined in claim 6, wherein the thickness of the first electrode at the bottom of the second opening is larger than the thickness of the first electrode disposed on the lateral side of the second opening.

8. A method of manufacturing a semiconductor device comprising:
   a step of forming a diffusion barrier layer on a substrate in which a transistor is formed,
   a step of forming a second film on the diffusion barrier layer,
   a step of patterning the diffusion barrier layer and the second film,
   a step of forming an insulation film to a region in which the diffusion barrier layer and the second film are not formed, and disposing the diffusion barrier layer and the second film to the opening in the insulation film,
   a step of removing the second film and
   a step of forming a first electrode film from a portion on the diffusion barrier layer of the opening to the side wall of the opening and forming a capacitor having the first electrode film.

9. A method of manufacturing a semiconductor device as defined in claim 8, wherein the second film is one of W, $Si_3N_4$ and Si.

10. A method of manufacturing a semiconductor device as defined in claim 8, wherein the step of patterning the diffusion barrier layer and the second film is a step of patterning by using an identical mask.

11. A method of manufacturing a semiconductor device as defined in claim 8, wherein the step of patterning the diffusion barrier layer and the second film is a step of etching the second film and the diffusion barrier layer continuously by using $SF_6$ as an etching gas the diffusion barrier layer being a titanium nitride film and the second film being tungsten.

12. A method of manufacturing a semiconductor device as defined in claim 8, wherein the step of patterning the diffusion barrier layer and the second film is a step of applying etching fabrication to a silicon nitride film by using a mixed gas of $NF_3$ and He or $O_2$ as an etching gas and then applying etching fabrication to a titanium nitride film by using $SF_6$ as an etching gas, the diffusion barrier layer being the titanium nitride film and the second film being the silicon nitride film.

13. A method of manufacturing a semiconductor device as defined in claim 8, wherein the step of patterning the diffusion barrier layer and the second film is a step of applying etching fabrication to a polycrystalline silicon film and a titanium nitride film continuously by using $SF_6$ as an etching gas, the diffusion barrier layer being a titanium nitride film and the second film being a polycrystalline silicon film.

14. A method of manufacturing a semiconductor device as defined in claim 8, wherein the insulation film of the capacitor is formed on both surfaces of the first electrode film formed on the lateral side.

15. A method of manufacturing a semiconductor device comprising:
   a step of forming a first insulation film in which a first conductive film is buried in the openings on a substrate in which a transistor is formed,
   a step of forming a diffusion barrier layer and a first electrode film on the first conductive film,
   a step of forming a second film of a predetermined pattern on the first electrode film,
   a step of patterning the first electrode film and the diffusion film barrier layer using the second film as a mask,
   a step of forming the second insulation film having the second opening on the first insulation film such that the second film, the first electrode film and the diffusion barrier layer are disposed in the second opening,
   a step of removing the second film by etching,
   a step of forming a first electrode film on the lateral side of the second opening, and
   a step of forming a third insulation film and a second electrode film on the first electrode film and forming a capacitor.

16. A method of manufacturing a semiconductor device as defined in claim 15, wherein the step of forming the second insulation film is a step of forming the second insulation film on the first insulation film in which the second film, the first electrode film and the diffusion barrier layer are formed and then polishing the second insulation film such that the second film, the first electrode film and the diffusion barrier layer are disposed in the second opening of the second insulation film.

17. A method of manufacturing a semiconductor device as defined in claim 15, wherein the upper end of the second film is etched by using the second film as a mask and the second insulation film is removed by polishing up to the height at the etched upper end.

18. A method of manufacturing a semiconductor device as defined in claim 15, wherein the second opening is formed in plurality and the first electrode is formed being isolated on every second openings.

19. A method of manufacturing a semiconductor device as defined in claim 15, wherein the third insulation film is formed on both surfaces of the first electrode film formed on the lateral side.

20. A method of manufacturing a semiconductor device comprising:
   a step of forming a first insulation film having a first opening in which a conductive film is filled in a memory mat section and a second opening in which a conductive film filled in the peripheral circuit section, on a substrate,
   a step of forming a diffusion barrier layer and a first electrode film on the first insulation film,
   a step of forming a second conductive film of a predetermined pattern on the first electrode film,
   a step of patterning by using the second conductive film as a mask such that the diffusion barrier layer and the first electrode film are left on the first opening and on the second opening,
   a step of forming a second insulation film having a third and fourth openings such that the second conductive film, the diffusion barrier layer and the first electrode film on the first opening are disposed to a third opening and the second conductive film, the diffusion barrier layer and the first electrode film on the second opening are disposed to a fourth opening,
   a step of removing the second conductive film in the third opening by etching while leaving the second conductive film in the fourth opening,
   a step of forming a first electrode film on the lateral side in the third opening, and
   a step of forming a third insulation film and a second electrode film in lamination on the first electrode film.

21. A method of manufacturing a semiconductor device as defined in claim 20, wherein the method includes a step of forming a third film after the step of forming the insulation film and before the step of forming the diffusion barrier layer.

22. A method of manufacturing a semiconductor device comprising:
   a step of forming a first insulation film having a first opening in which a conductive film is filled in a memory mat section and a second opening in which a conductive film is filled in a peripheral circuit section on a substrate,
   a step of forming a diffusion barrier layer on the first insulation film,
   a step of forming a second conductive film of a predetermined pattern on the diffusion barrier layer,
   a step of patterning using the second conductive film as a mask such that the diffusion barrier layer is left on the first opening and on the second opening,
   a step of forming a second insulation film having the third and fourth openings such that the second conductive film and the diffusion barrier layer on the first opening are disposed to a third opening and the second conductive film and the diffusion barrier layer on the second opening are disposed in the fourth opening,
   a step of removing the second conductive film in the third opening by etching while leaving the second conductive film in the fourth opening,
   a step of forming a first electrode film at the bottom and the lateral side in the third opening, and
   a step of forming a third insulation film and a second electrode film in lamination on the first electrode film.

23. A method of manufacturing a semiconductor device as defined in claim 22, wherein the method includes a step of forming a third film after the step of forming the first insulation film or before the step of forming the diffusion barrier layer.

24. A method of manufacturing a semiconductor device comprising:
   a step of forming a first insulation film having an opening on a substrate in which a transistor is formed,
   a step of burying a first conductive film in the first opening,
   a step of forming a diffusion barrier layer and a platinum film on the first conductive film,
   a step of forming a second film of a predetermined pattern on the platinum film,
   a step of patterning the platinum film and the diffusion barrier layer using the second film as a mask,
   a step of forming a second insulation film on the first insulation film such that the platinum film and the diffusion barrier layer is disposed in the second opening of the second insulation film,
   a step of removing the second film by etching,
   a step of forming a platinum film on the lateral side of the second opening, and
   a step of forming a third insulation film and a second electrode film on the platinum film to form a capacitor.

25. A method of manufacturing semiconductor device as defined in claim 24, wherein the step of forming the platinum film on the lateral side of the second opening is conducted by electroless plating.

26. A method of manufacturing semiconductor device as defined in claim 25, wherein the step of forming the platinum film on the lateral side of the second opening is formed by electroless plating using, as a seed layer, platinum deposited on the side wall of the second film upon etching the platinum film using the second film as a mask.

27. A method of manufacturing semiconductor device as defined in claim 24, wherein the second opening is disposed in plurality, the platinum film is formed also on the second insulation film between the openings and, subsequently, the platinum film on the second insulation film is removed by etching to isolate the platinum film on every openings.

28. A semiconductor device comprising
   a substrate in which a switching transistor is formed,
   a first conductive film formed on the substrate,
   a diffusion barrier layer formed at the bottom of an opening in an insulation film on the first conductive film and
   a capacitor extended from a portion on the diffusion barrier layer to the lateral side of the opening and having a first electrode formed in contact with the upper surface of the diffusion barrier layer and the insulation film exposed to the lateral size of the opening.

29. A semiconductor device as defined in claim 28, wherein the insulation film of the capacitor comprises perovskite type oxides.

30. A semiconductor device as defined in claim 29, wherein the vecovskite type oxides are one of strontium barium titanate, strontium titanate, barium titanate, lead zirconate titanate and barium lead zirconate titanate.

31. A semiconductor device as defined in claim 28, wherein the insulation film of the capacitor comprises tantalum pentoxide.

32. A semiconductor device as defined in claim 28, wherein the diffusion barrier layer has at least one layer of Ti, Ta, TiN, $Al_xTi_{1-x}N$ and Ru.

33. A semiconductor device comprising
   a substrate in which a switching transistor is formed,
   a first insulation film formed on the substrate and having a first opening,
   a first conductive film disposed in the first opening and connected electrically with the diffusion layer of the transistor,
   a second insulation film formed on the first insulation film and having a second opening,
   a diffusion layer formed at the bottom of the second opening, and
   a capacitor disposed from a portion on the diffusion barrier layer to the lateral side of the second opening having a first electrode in which the area and the outer circumference in the horizontal direction at the bottom in contact with the diffusion barrier layer are substantially identical with the area and the outer circumference in the horizontal direction of the diffusion barrier layer.

34. A semiconductor device comprising
   a substrate in which a switching transistor is formed,
   a first insulation film formed on the substrate and having a first opening,
   a first conductive film disposed in the first opening and connected electrically with the diffusion layer of the transistor,
   a second insulation film formed on the first insulation film and having a second opening,
   a diffusion barrier layer formed at the bottom of the second opening, and
   a capacitor disposed from a portion on the diffusion barrier layer to the lateral side of the second opening in which the thickness of the first electrodes at the bottom of the second opening is larger than the thickness of the first electrode disposed on the lateral side of the second opening.

35. A semiconductor device comprising a substrate in which a switching transistor is formed, a first conductive film formed on the substrate, a diffusion barrier layer formed at the bottom of an opening in an insulation film on the first conductive film and a capacitor extended from a portion on the diffusion barrier layer to the lateral side of the opening and having a first electrode formed in self alignment with the diffusion barrier layer in which the thickness of the first electrode at the bottom of the second opening is larger than the thickness of the first electrode disposed on the lateral side of the second opening.

* * * * *